(12) United States Patent
Chang et al.

(10) Patent No.: US 6,714,088 B2
(45) Date of Patent: Mar. 30, 2004

(54) LOW-PHASE-NOISE OSCILLATOR WITH A MICROSTRIP RESONATOR

(75) Inventors: Sheng-Fuh Chang, Chia-Yi Hsien (TW); Jia-Liang Chen, Kao-Hsiung (TW); Shi-Wei Kuo, Hsin-Chu (TW)

(73) Assignee: Accton Technology Corporation, Hsin-Chu (TW)

( * ) Notice: Subject to any disclaimer, the term of this patent is extended or adjusted under 35 U.S.C. 154(b) by 68 days.

(21) Appl. No.: 10/065,292

(22) Filed: Oct. 1, 2002

(65) Prior Publication Data

US 2003/0160660 A1 Aug. 28, 2003

(30) Foreign Application Priority Data

Feb. 22, 2002 (TW) ........................................ 91103204 A (51) Int. Cl.$^7$ ................................................. H03B 7/14
(52) U.S. Cl. ............................ 331/107 SL; 331/117 D; 331/99
(58) Field of Search ..................... 331/107 SL, 117 D, 331/99

(56) References Cited

U.S. PATENT DOCUMENTS

| | | | | |
|---|---|---|---|---|
| 3,659,222 A | * | 4/1972 | Assour et al. | ................ 331/99 |
| 3,721,918 A | * | 3/1973 | Rosen et al. | ................... 331/96 |
| 4,484,156 A | * | 11/1984 | Khanna et al. | ................ 331/60 |
| 4,518,931 A | * | 5/1985 | Rauscher | ...................... 331/76 |
| 4,639,691 A | * | 1/1987 | Iigima | ......................... 331/99 |
| 4,660,002 A | * | 4/1987 | Iijima et al. | ................ 332/130 |
| 5,079,524 A | * | 1/1992 | Sugawara | .................... 331/96 |
| 5,309,117 A | * | 5/1994 | Cadotte et al. | ............... 331/66 |
| 5,834,981 A | * | 11/1998 | Trier et al. | .................... 331/99 |
| 6,124,767 A | * | 9/2000 | Woods | .................. 331/117 D |
| 6,369,664 B1 | * | 4/2002 | Muto et al. | ............. 331/117 D |
| 6,380,814 B1 | * | 4/2002 | Imaoka | ........................ 331/96 |
| 6,535,072 B2 | * | 3/2003 | Yamashita et al. | ...... 331/107 G |

* cited by examiner

Primary Examiner—Robert Pascal
Assistant Examiner—Joseph Chang
(74) Attorney, Agent, or Firm—Winston Hsu (57) ABSTRACT

A low-phase noise oscillator with a microstrip resonator for generating a target signal with a predetermined frequency is provided. The resonator includes a first microstrip line and a second microstrip line. The first microstrip line is parallel with the second microstrip line without having any contact. A length of the first microstrip line equals a length of the second microstrip line, and the length equals a quarter wavelength of the target signal. When a plurality of oscillating signals is transmitted to the first microstrip line, one of the oscillating signals having the predetermined frequency will be output from the resonator by an electromagnetic coupling generated between the first microstrip line and the second microstrip line.

12 Claims, 6 Drawing Sheets

LOW-PHASE-NOISE OSCILLATOR WITH A MICROSTRIP RESONATOR

BACKGROUND OF INVENTION

1. Field of the Invention

The present invention relates to an oscillator, and more particularly, to a low-phase noise oscillator with a microstrip resonator.

2. Description of the Prior Art

Although nearly all the current local area networks (LAN) were constructed using a wired network structure, wireless network structures are becoming increasingly popular, especially at university campuses, hospitals, and manufacturing plants. A wireless network structure is ideal for a small area communication system because of its low-cost and simple construction. To guarantee that wireless network equipment is compatible, the institute of electrical and electronics engineers (IEEE) set a first standard IEEE 802.11 in 1997, and then made amendments IEEE 802.11a, IEEE 802.11b in September 1999. The standards define elementary data transmission methods and service transmission frequency. These standards are applied in industrial, scientific, and medical (ISM) frequency bands, including 902~928 MHz, 2.4~2.4835 GHz, 5.150~5.350 GHz, and 5.725~5.850 GHz.

Superheterodyne, heterodyne, and zero IF or direct conversion structure, as used in radio before, are currently still the most popular communication structures. Because a baseband circuit is mainly used to process signals, such as modulating, demodulating, encoding or decoding signals, it is usually manufactured using an integrated circuit manufacturing process. However, IF circuits and RF circuits are mainly used to receive and transmit radio signals, so they must bear a high signal-to-noise ratio (SNR). Therefore, each component, particularly an oscillator, in a wireless communication circuit must bear a high Q factor.

A resonator is an important element in many electrical systems and can be used to fabricate a filter or an oscillator. In manufacturing a resonator, many factors should be taken into consideration, such as size, cost, Q factor, and dependability. Some popular resonators are illustrated as follows. The first one is a resonator formed by a plurality of capacitors and inductors. It has a low Q factor because of the power consumption of the capacitors and the inductors. The second one is a coaxial resonator, which is large and expensive. The third one is a cavity resonator. It has a rectangular, cylindrical or spherical shape and is formed of conductive materials, and consequently has the characteristics of low power consumption and high Q factor, but large volume. The fourth one is a dielectric resonator, which is formed by a dielectric sphere. Although the dielectric resonator has a small volume, low power consumption, and high Q factor, manufacturing a dielectric resonator is still expensive. The last resonator is a microstrip resonator, which is formed by disposing a conductive strip onto a circuit board. Because one terminal of a microstrip resonator is open, microwave radiation will consume power so as to make the microstrip resonator have a low Q factor.

Standard integrated circuits are planar circuits, so only those resonators having a planar structure, such as the microstrip resonator, are suitable for designing a microwave integrated circuit (MMIC) or radio frequency integrated circuit (RFIC). A conventional microstrip resonator has a low Q factor and consequently designing a low-phase-noise oscillator with such microstrip resonator is difficult.

SUMMARY OF INVENTION

It is therefore a primary objective of the claimed invention to provide an oscillator with a high Q factor.

According to the claimed invention, a low-phase-noise oscillator with a microstrip resonator for generating a target signal with a predetermined frequency is provided. The oscillator includes an oscillating circuit for generating a plurality of signals with different frequencies, and a first resonator. The first resonator includes an input port connected to an output port of the oscillating circuit, an output port for outputting the target signal, a circuit board having a metal membrane which functions as a ground layer for providing a reference voltage, a first microstrip line with a first predetermined length being positioned on the circuit board and coupling with the metal membrane for forming a first transmission line structure. The first microstrip line has a first terminal and a second terminal. The first terminal is connected to the input port of the first resonator. The predetermined frequency of the target signal is determined according to the first predetermined length. The first resonator also includes a second microstrip line with a second predetermined length being positioned on the circuit board and coupling with the metal membrane of the circuit board for forming a second transmission line structure. The second microstrip line has a first terminal and a second terminal. The first and the second microstrip lines are conductive bars and the first microstrip line is parallel with the second microstrip line without any contacts. Either the second terminal of the first microstrip line or the second terminal of the second microstrip line is connected to the output port of the first resonator. When the oscillating circuit generates signals with different frequencies to the input port of the first resonator, a signal with the predetermined frequency is outputted from the output port of the first resonator to be the target signal through an electromagnetic coupling between the first and second microstrip lines of the first resonator.

It is an advantage of the claimed invention that an oscillator with a microstrip resonator can provide a high Q factor and consequently a low phase noise.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
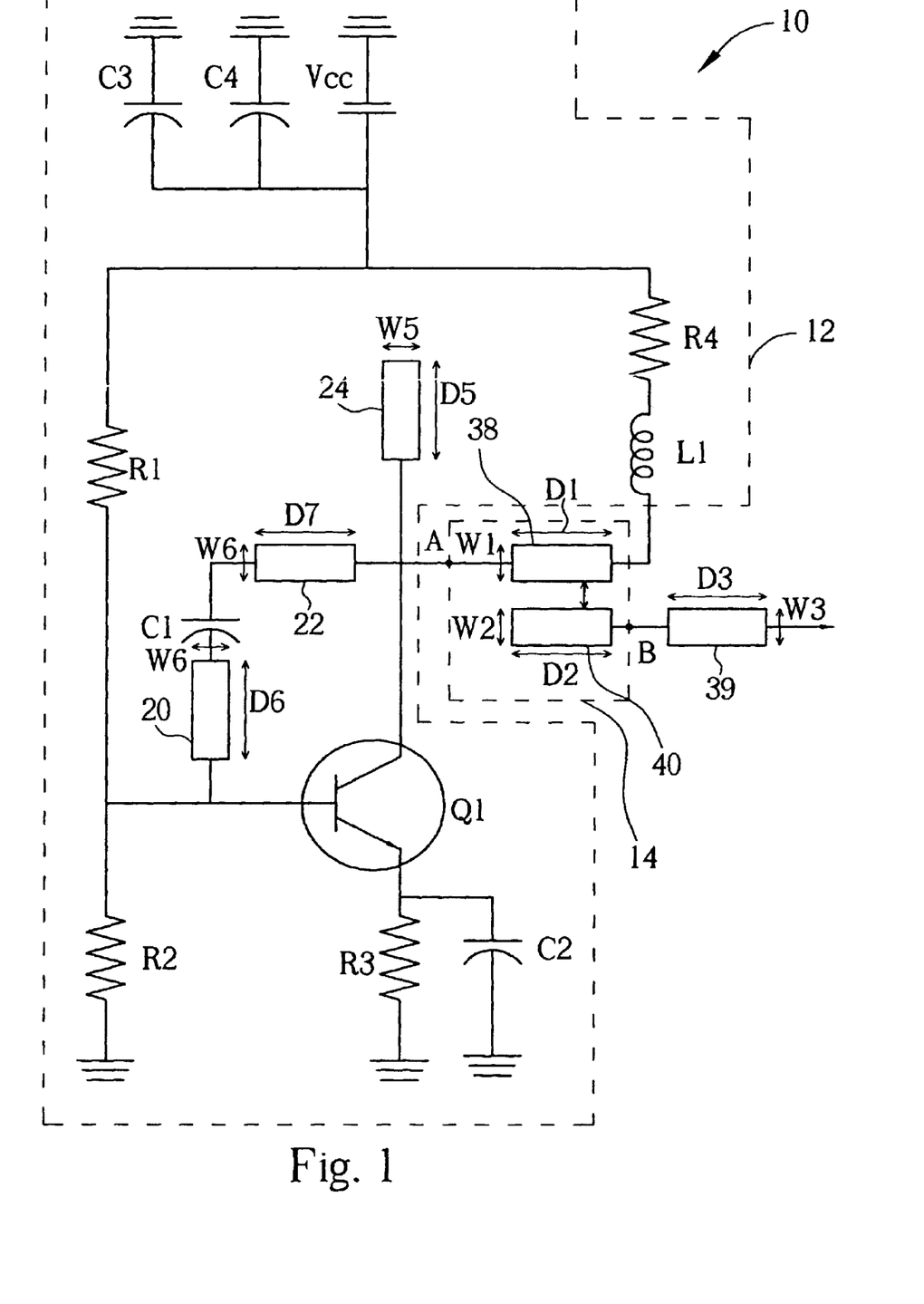
FIG. 1 is a schematic diagram of an oscillator according to the present invention.
Figure 2:
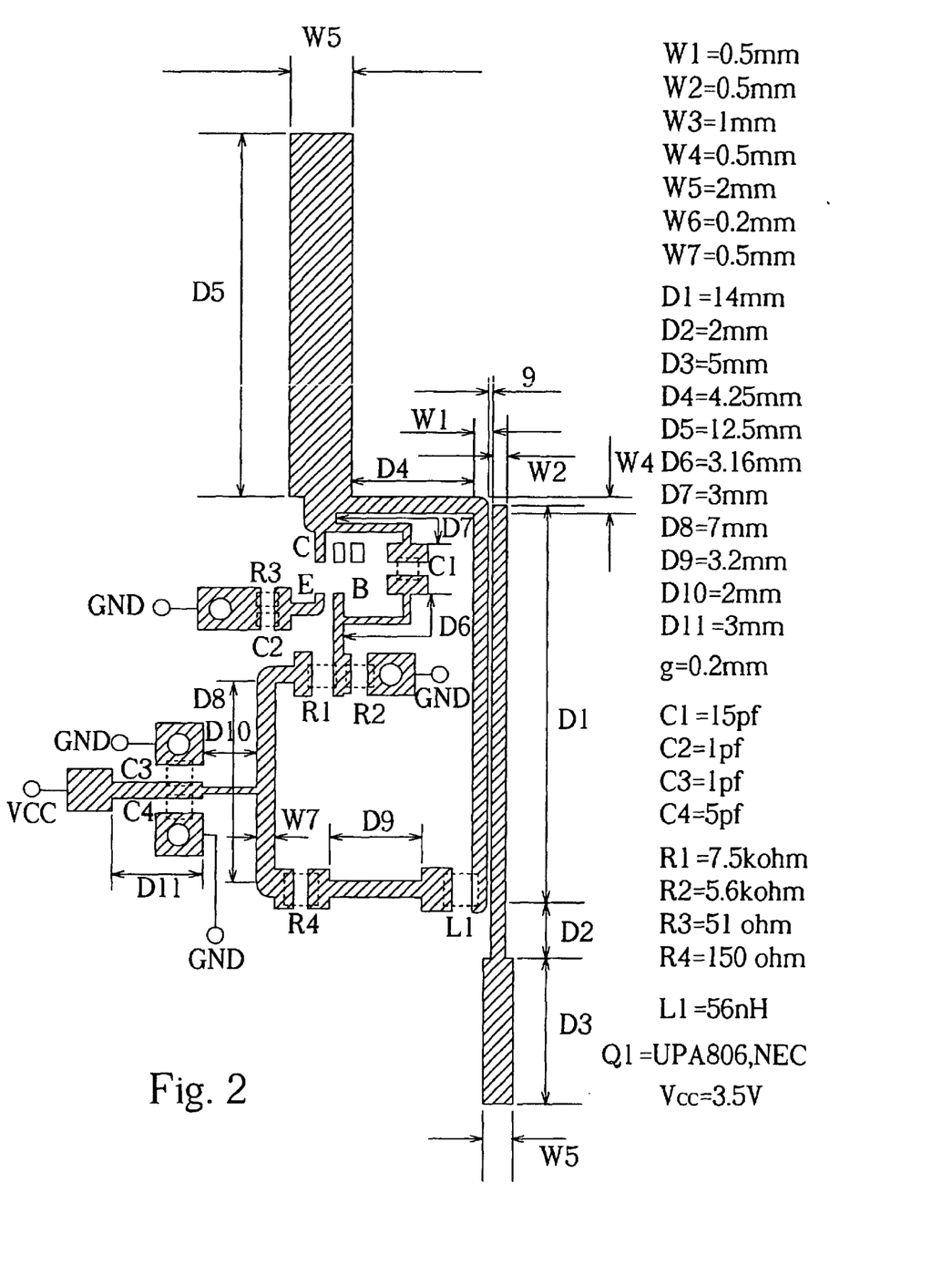
FIG. 2 is a layout diagram of the oscillator shown in FIG. 1.

Please refer to FIG. 1 and FIG. 2. FIG. 1 is a schematic diagram of an oscillator 10 according to the present invention. FIG. 2 is a layout diagram of the oscillator 10 shown in FIG. 1. The oscillator 10 comprises an oscillator circuit 12 and a resonator 14. The oscillator 10 is disposed on one side of a circuit board (not shown), and a metal membrane, serving as a ground terminal, is disposed on the other side of the circuit board. The oscillator circuit 12 is used to generate a plurality of oscillating signals via an input terminal A of the resonator 14, and output a target signal with a predetermined frequency via an output terminal B of the resonator 14. The oscillator circuit 12 comprises a voltage source Vcc, a plurality of capacitors C1, C2, C3, C4, a plurality of microstrips 20, 22, 24, a plurality of resistors R1, R2, R3, R4, a transistor Q1, and an RF choke inductance L1. The voltage source Vcc is used to provide a stable bias voltage. The capacitors C3 and C4 are used to filter glitches existing in the voltage source Vcc, thus allowing the voltage source Vcc to output a stable voltage having a predetermined voltage level. The microstrips 20, 22, and 24 are used to change an impedance characteristic of the oscillator circuit 12. The transistor Q1 is operated in an active region and is used in conjunction with the microstrips to provide functionality to the oscillator circuit 12. An NEC UPA 806 transistor is used in the preferred embodiment. Additionally, the RF choke inductance L1 is used to prevent the target signal generated by the resonator 14 from creating feedback in the oscillator circuit 12. The microstrips 20, 22, and 24 of the oscillator 10 are also used to transmit high frequency signals by forming transmission line structures with the metal membrane.

The resonator 14 comprises a microstrip 38 and a microstrip 40, which are conductive bars and are parallel without any contact with each other. Each microstrip 38 and 40 has one terminal that is an open circuit and a second terminal that is connected respectively to the input terminal A and the output terminal B of the resonator 14. The oscillator 10 further comprises a microstrip 39 connected to the microstrip 40 for outputting signals. When the oscillator circuit 12 generates a plurality of oscillating signals having different frequencies, only oscillating signals with the predetermined frequency will be output from the resonator 14 by an electromagnetic coupling generated between the microstrip 38 and the microstrip 40, and will be output via the output terminal B of the resonator 14. The length and width of the microstrip 20 are respectively D6 and W6. The length and width of the microstrip 22 are respectively D7 and W6. The length and width of the microstrip 24 are respectively D5 and W5. The length and width of the microstrip 38 are respectively D1 and W1. The length and width of the microstrip 40 are respectively D2 and W2. The length and width of the microstrip 39 are respectively D3 and W3. The microstrip 38 is separated from the microstrip 40 by a distance g. Detailed specifications of all the above elements are shown in FIG. 2. The driving principles of the oscillator circuit 12 are as follows.

Figure 3:
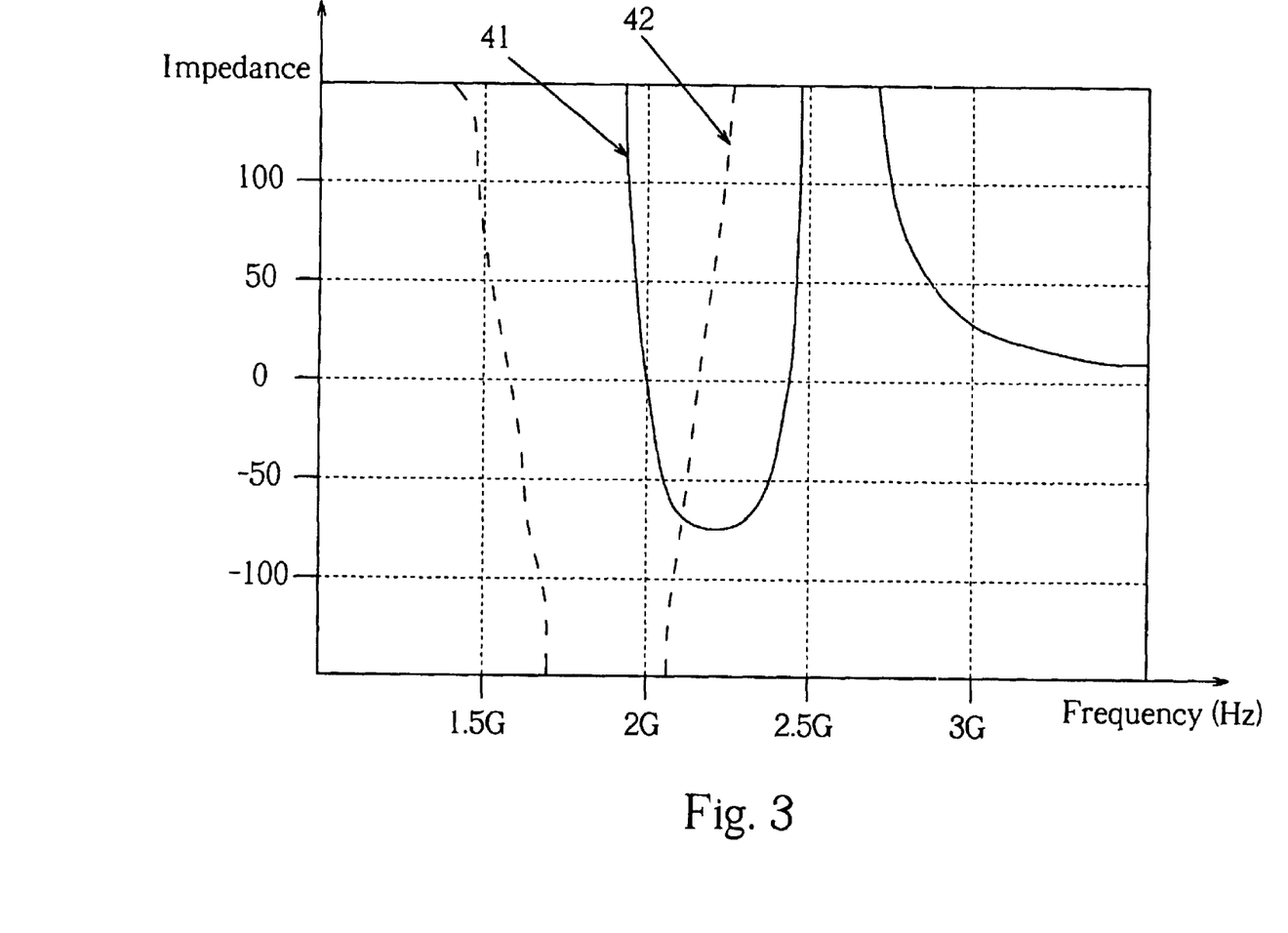
FIG. 3 is an impedance characteristic diagram of the oscillator circuit shown in FIG. 2.

Please refer to FIG. 1 and FIG. 3. FIG. 3 is an impedance characteristic diagram of the oscillator circuit 12 shown in FIG. 1. A curve 41 represents a resistance characteristic and a curve 42 a reactance characteristic of the oscillator circuit 12. If the oscillator 10 is applied in an ISM band and the frequency of the target signal is 2.4 GHz, the oscillator circuit 12 will not output a plurality of oscillating signals having different frequencies via the input terminal A of the resonator 14 until a certain start-up oscillation condition is satisfied. That start-up condition is: the equivalent impedance according to the input terminal A of the oscillator circuit 12 must be negative. When the equivalent resistance of the oscillator circuit 12 is kept negative, the reactance of the oscillator circuit 12 must vary from negative to positive. For example, if the frequency for the target signal ranges from 2 GHz to 2.5 GHz, the resistance of the oscillator circuit 12 is negative and the reactance of the oscillator circuit 12 varies from capacitance to inductance. As well known by those skilled in the art, the resistance of the oscillator circuit 12 is preferred to be about 100 ohms to prevent the oscillator 10 from being sensitive to noise.

Figure 4:
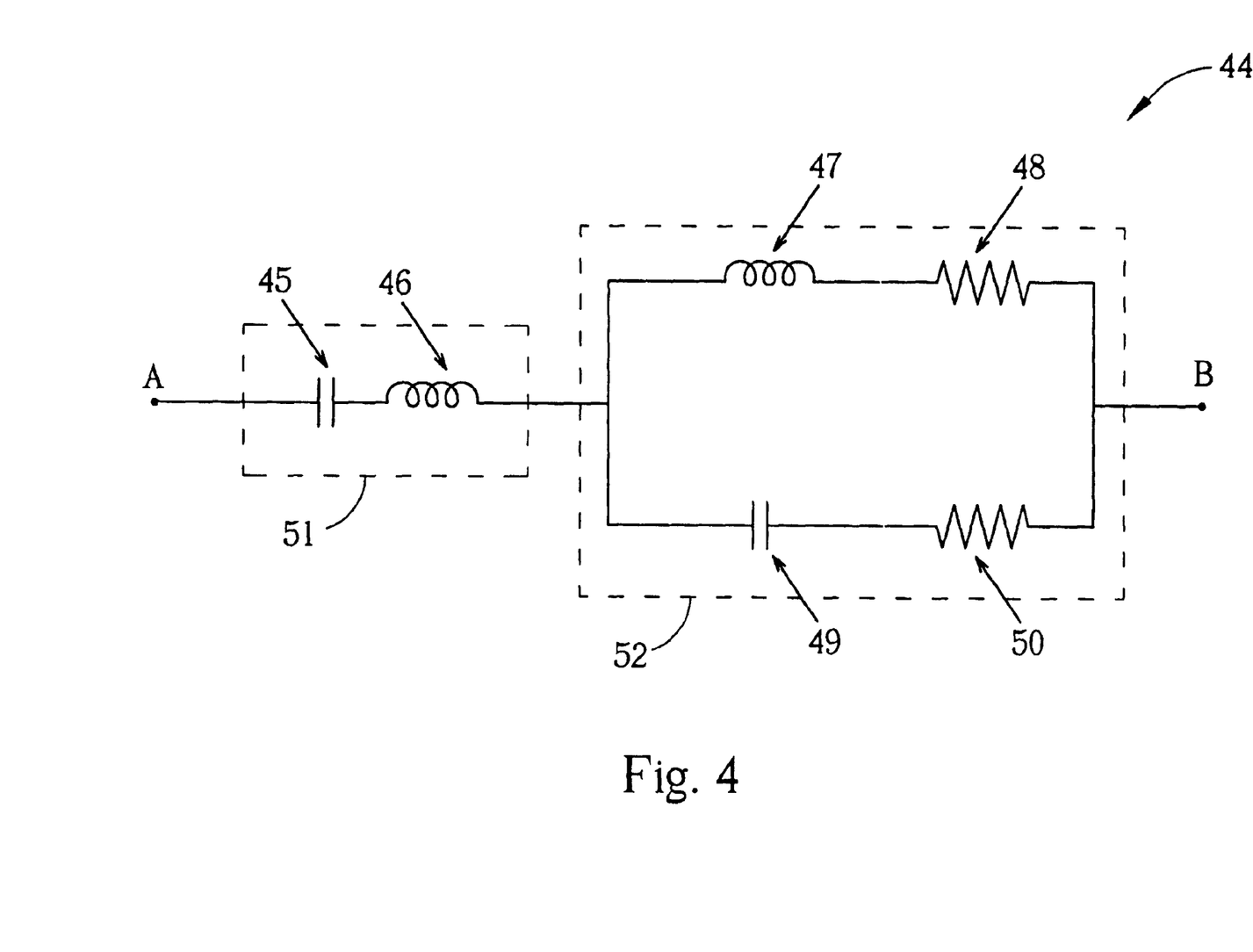
FIG. 4 is an equivalent circuit diagram of the resonator shown in FIG. 1.
Figure 5:
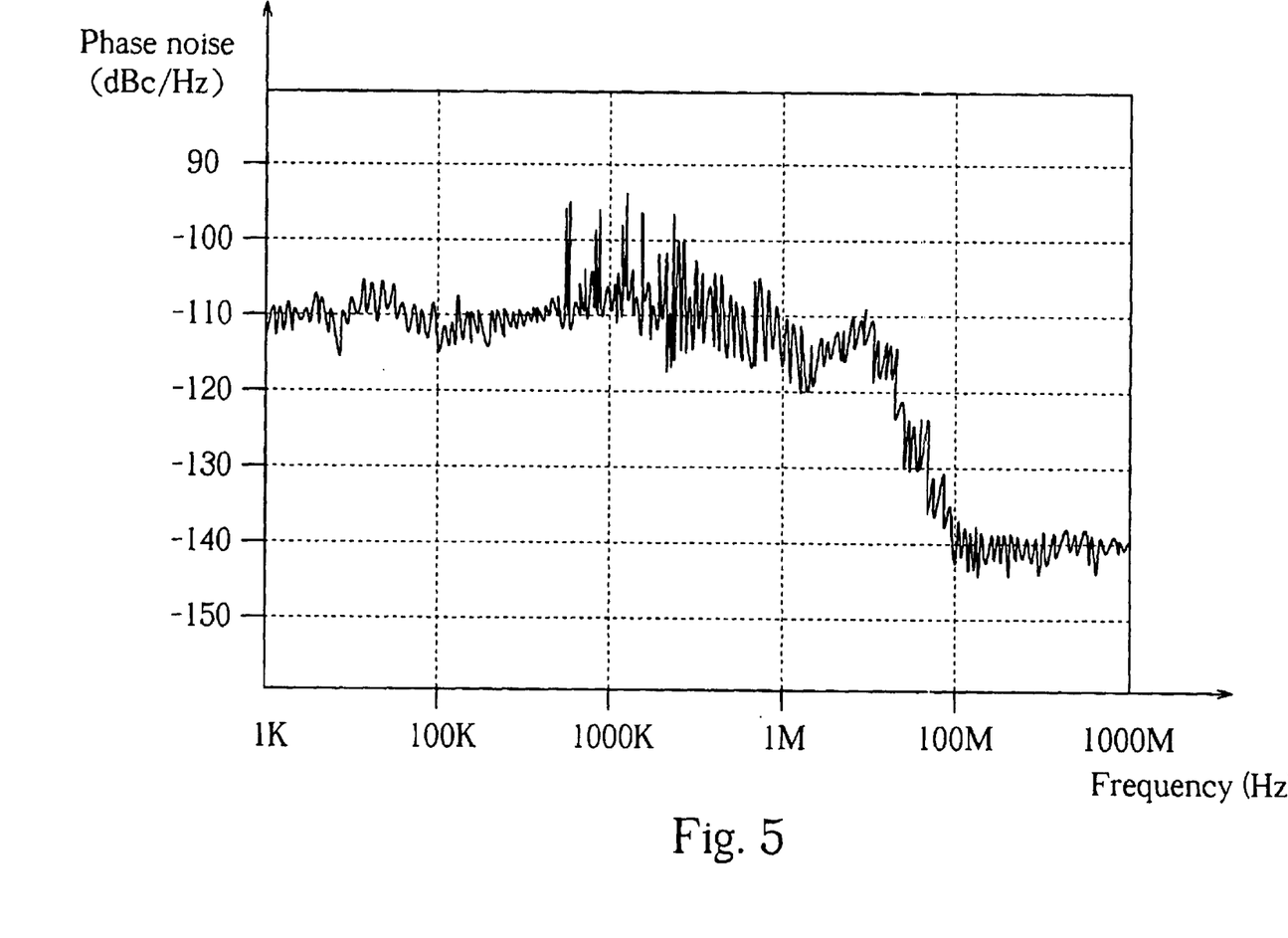
FIG. 5 is a phase noise diagram of the oscillator circuit shown in FIG. 1.

Please refer to FIG. 1, FIG. 4, and FIG. 5. FIG. 4 is an equivalent circuit diagram of the resonator 14 shown in FIG. 1. FIG. 5 is a phase noise diagram of the oscillator 10 shown in FIG. 1. To make the oscillator 10 output a target signal with a frequency of 2.4 GHz according to the preferred embodiment, the length D1 and the width W1 of the microstrip 38 are respectively 14 mm and 0.5 mm; the length D1 and the width W2 of the microstrip 40 are also respectively 14 mm and 0.5 mm. The distance g separating the microstrip 38 and the microstrip 40 is 0.2 mm. The length for the microstrip 38 is exactly a quarter wavelength of the target signal. As confirmed by experiment, the resonator 14 will generate a resonance when the frequency of the target signal is 1.8 GHz or 3.05 GHz. The equivalent circuit 44 comprises two capacitors 45, 49, two resistors 48, 50, and two inductors 46, 47. The values of the above elements 45, 49, 48, 50, 46, and 47 are respectively 1.5 pF, 1.46 pF, 0.1 ohm, 0.2 ohm, 1.8 nH, and 1.89 nH. The capacitor 45 combined with the inductor 46 form a serial resonance circuit 51. The inductor 47, the resistors 48, 50, and the capacitor 49 form a shunt resonance circuit 52. The resonance frequency of the serial resonance circuit 51 is 1.8 GHz whereas the resonance frequency of the shunt resonance circuit 52 is 3.05 GHz. The frequency of the target signal ranges from 1.8 GHz to 3.05 GHz. The serial resonance circuit 51 is an equivalent circuit of the microstrip 38 whereas the shunt resonance circuit 52 is an equivalent circuit of an electromagnetic coupling generated between the microstrip 38 and the microstrip 40. In the preferred embodiment, adjusting the resonance frequency of the serial resonance circuit 51 and the shunt resonance circuit 52 can increase a corresponding Q factor. The Q factor of the shunt resonance circuit 52 is larger than that of a conventional microstrip resonator. According to the present invention, the microstrip 40 is used to increase the Q factor of the microstrip 38.

In a prior art, only a single microstrip is used to serve as a resonance element in a resonator, so a Q factor of the resonator is low. According to the present invention, however, the electromagnetic coupling effect generated between the microstrip 38 and the microstrip 40 effectively increases the Q factor of the resonator 14. Please refer to FIG. 5 again. The phase noise of the oscillator 10 is 110 dBc/Hz at the frequency 1 kHz offset from the target signal frequency, and 140 dBc/Hz at the frequency 100 MHz offset from the target signal frequency. In the preferred embodiment, the target signal is output via the output terminal B of the resonator 14 through the microstrip 40. However, if the output terminal B of the resonator 14 and is connected to the microstrip 38 are connected and both terminals of the microstrip 40 are left open, the target signal can also be output via the output terminal B of the resonator 14. Furthermore, the oscillator 10 can be installed on a multiple-layer circuit board wherein the microstrips 38 and the microstrip 40 are disposed on different layers of the board.

Figure 6:
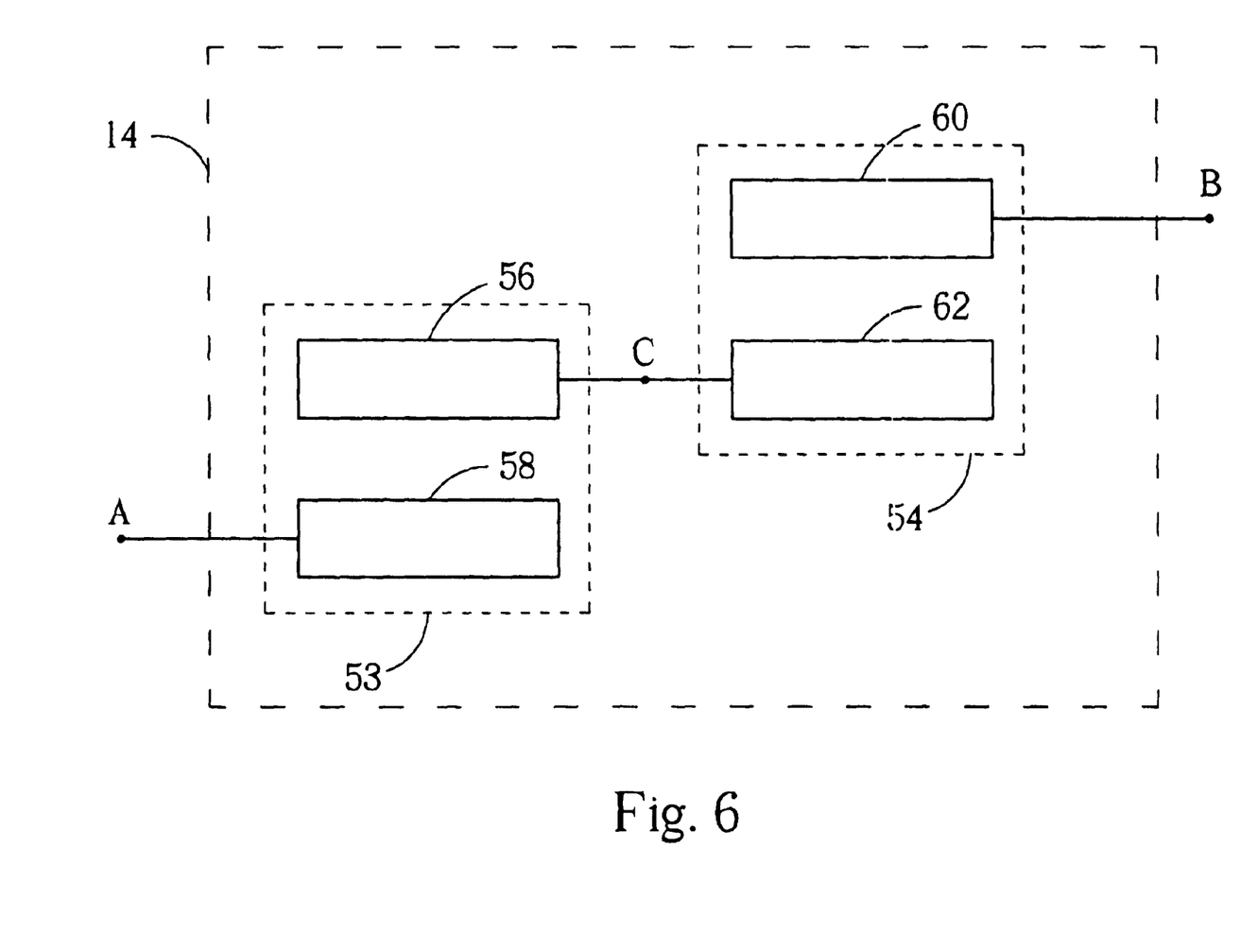
FIG. 6 is a schematic diagram of a second embodiment of the resonator shown in FIG. 1.

Please refer to FIG. 1 and FIG. 6. FIG. 6 is a schematic diagram of a second embodiment of the resonator 14. The resonator 14 comprises a first resonator 53 and a second resonator 54. The two resonators 53, 54 are connected via a terminal C. The first resonator 53 comprises two microstrips 56, 58. The second resonator 54 comprises two microstrips 60, 62. All of the above microstrips are conductive bars. The microstrips 56, 58 and the microstrips 60, 62 are respectively mutually parallel without any contact to each other.

The lengths of the four microstrips are identical and equal a quarter wavelength of the target signal. When the oscillator circuit 12 generates a plurality of oscillating signals having different frequencies, only the target signal with a predetermined frequency will be output by the first resonator 53 by a first electromagnetic coupling generated between the microstrip 56 and the microstrip 58. Then the target signal will be output by the second resonator 54 with a second electromagnetic coupling generated between the microstrip 60 and the microstrip 62. The frequency of the signal output at a terminal B of the resonator 54 is identical to that of the signal output at the terminal C of the resonator 53.

In the second embodiment, the input terminal A of the resonator 14 is connected to the microstrip 58 of the first resonator 53 whereas the output terminal B of the resonator 14 is connected to the microstrip 60 of the second resonator 54. However, the input terminal A of the resonator 14 can also be connected to the microstrip 56 of the first resonator 53, and the output terminal B can also be connected to the microstrip 62 of the second resonator 54. Furthermore, the first resonator 53, the second resonator 54, and the resonator 14 can be serially connected. Additionally, the first resonator 53 and the second resonator 54 can also be cascaded into more than one resonator 14.

In contrast to the prior art, the resonator of the oscillator comprises two coupled microstrips. When the oscillator circuit generates a plurality of oscillating signals, a target signal with a predetermined frequency is output via the output terminal of the resonator. Because the Q factor of the equivalent shunt resonance circuit of the oscillator circuit is high, the Q factor of the resonator is correspondingly increased so as to allow the resonator to have a low-phase noise.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. An oscillator for generating a target signal with a predetermined frequency comprising:
   an oscillating circuit for generating a plurality of signals with different frequencies; and
   a first resonator comprising:
      an input port connected to an output port of the oscillating circuit;
      an output port for outputting the target signal;
      a circuit board comprising a metal membrane which functions as a ground layer for providing a reference voltage;
      a first microstrip line with a first predetermined length being positioned on the circuit board and coupling with the metal membrane for forming a first transmission line structure, the first microstrip line comprising a first terminal and a second terminal, the first terminal connected to the input port of the first resonator, the predetermined frequency of the target signal being determined according to the first predetermined length; and
      a second microstrip line with a second predetermined length being positioned on the circuit board and coupling with the metal layer of the circuit board for forming a second transmission line structure, the second microstrip line comprising a first terminal and a second terminal;
   wherein the first and second microstrip lines are conductive bars, the first microstrip line is parallel with the second microstrip line without being connected to the second microstrip line between the corresponding first and second terminals of the first and second microstrip lines, either the second terminal of the first microstrip line or the second terminal of the second microstrip line is connected to the output port of the first resonator, and when the oscillating circuit generates signals with different frequencies to the input port of the first resonator, a signal with the predetermined frequency is outputted from the output port of the first resonator to be the target signal through an electromagnetic coupling between the first and second microstrip lines of the first resonator.

2. The oscillator of claim 1 wherein the second terminal of the second microstrip line is connected to the output port of the first resonator, and the second terminal of the first microstrip line and the first terminal of the second microstrip line are both open circuits.

3. The oscillator of claim 1 wherein the first predetermined length of the first microstrip line is equal to the second predetermined length of the second microstrip line.

4. The oscillator of claim 3 wherein the first and second microstrip lines of the first resonator are both positioned on a plane of the circuit board.

5. The oscillator of claim 3 wherein the circuit board is a multilayer circuit board, the first microstrip line and the second microstrip line are respectively positioned on different layers, and the first microstrip line is superposed on the second microstrip line.

6. The oscillator of claim 3 wherein the first predetermined length of the first microstrip line is equal to a quarter wavelength of the target signal.

7. The oscillator of claim 1 wherein a reactance of the oscillating circuit is driven from a capacitive characteristic to an inductive characteristic, and a resistance of the oscillating circuit is negative for the first and second microstrip lines.

8. The oscillator of claim 7 wherein a resonance frequency of the first microstrip line is lower than the predetermined frequency of the target signal.

9. The oscillator of claim 7 wherein a resonance frequency of the second microstrip line is lower than the predetermined frequency of the target signal.

10. The oscillator of claim 1 further comprising a second resonator comprising:
   an input port connected to the output port of the first resonator;
   an output port;
   a third microstrip line with a third predetermined length being positioned on the circuit board and coupling with the metal layer of the circuit board for forming a third transmission line structure, the third microstrip line comprising
   a first terminal and a second terminal, the first terminal connected to the input port of the second resonator, the third predetermined length being equal to the first predetermined length; and
   a fourth microstrip line with a fourth predetermined length being positioned on the circuit board and coupling with the metal layer of the circuit board for forming a fourth transmission line structure, the fourth microstrip line comprising a first terminal and a second terminal;
   wherein the third and fourth microstrip lines are both conductive bars, the third microstrip line is parallel with the fourth microstrip line without being connected to the fourth microstrip line between the corresponding first and second terminals of the third and fourth microstrip lines, the second terminal of the third microstrip line or the fourth microstrip line is connected to the output port of the second resonator, and when the first resonator outputs the target signal to the input port of the second resonator, a signal with the predetermined frequency of the target signal is outputted from the output port of the second resonator through an electromagnetic coupling between the third and fourth microstrip lines of the second resonator.

11. The oscillator of claim 1 wherein the first resonator further comprises a fifth microstrip line with a fifth predetermined length being positioned on the circuit board and coupling with the metal layer of the circuit board for forming a fifth transmission line structure, the fifth microstrip line is a conductive bar comprising a first terminal and a second terminal, the fifth microstrip line is parallel with both the first and second microstrip lines without being connected to the first and second microstrip lines between the corresponding first and second terminals of the first, second and fifth microstrip lines, the first terminal of the fifth microstrip line is an open circuit, and the second terminal of the fifth microstrip line is connected to either the second terminal of the first microstrip line or the second terminal of the second microstrip line.

12. The oscillator of claim 11 wherein the lengths of the first, second and fifth microstrip lines are the same.

* * * * *